(12) United States Patent
Imada et al.

(10) Patent No.: US 7,100,263 B2
(45) Date of Patent: Sep. 5, 2006

(54) STRUCTURE MANUFACTURING METHOD

(75) Inventors: Aya Imada, Kanagawa (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 225 days.

(21) Appl. No.: 10/865,403

(22) Filed: Jun. 9, 2004

(65) Prior Publication Data

US 2004/0253817 A1 Dec. 16, 2004

(30) Foreign Application Priority Data

Jun. 16, 2003 (JP) ............................. 2003-171113

(51) Int. Cl.
*B21D 39/00* (2006.01)
*H01L 21/76* (2006.01)
*H01L 29/06* (2006.01)

(52) U.S. Cl. ........................ 29/514; 29/557; 29/558; 216/44; 216/52; 438/401; 438/691; 257/758; 257/797

(58) Field of Classification Search ................ 29/514, 29/557, 558; 216/44, 52, 53; 438/401, 424, 438/427, 691, 700, 735; 257/623, 758, 797
See application file for complete search history.

(56) References Cited

U.S. PATENT DOCUMENTS

| | | | | |
|---|---|---|---|---|
| 4,394,196 A | * | 7/1983 | Iwai | ............................ 438/296 |
| 5,772,905 A | | 6/1998 | Chou | |
| 5,981,354 A | * | 11/1999 | Spikes et al. | ................. 438/424 |
| 6,080,659 A | * | 6/2000 | Chen et al. | ................... 438/633 |
| 6,103,574 A | * | 8/2000 | Iwasaki | ........................ 438/257 |
| 6,136,662 A | * | 10/2000 | Allman et al. | ............... 438/401 |
| 6,143,625 A | * | 11/2000 | Chen et al. | ................... 438/435 |
| 6,288,454 B1 | * | 9/2001 | Allman et al. | ............... 257/797 |
| 6,375,870 B1 | * | 4/2002 | Visovsky et al. | ........... 264/1.31 |
| 6,610,463 B1 | * | 8/2003 | Ohkura et al. | ............... 430/322 |
| 6,878,634 B1 | * | 4/2005 | Imada et al. | .................. 438/700 |
| 6,924,023 B1 | * | 8/2005 | Ohkura et al. | ............... 428/138 |
| 6,943,117 B1 | * | 9/2005 | Jeong et al. | .................. 438/694 |
| 6,949,199 B1 | * | 9/2005 | Gauzner et al. | ................ 216/2 |
| 6,964,793 B1 | * | 11/2005 | Willson et al. | .............. 427/466 |
| 2004/0253817 A1 | * | 12/2004 | Imada et al. | ................. 438/688 |

FOREIGN PATENT DOCUMENTS

| | | |
|---|---|---|
| EP | 931859 A1 * | 7/1999 |
| JP | 10-121292 | 5/1998 |
| JP | 2000-232095 | 8/2000 |
| JP | 2001-138300 | 5/2001 |

* cited by examiner

*Primary Examiner*—Essama Omgba
(74) *Attorney, Agent, or Firm*—Morgan & Finnegan LLP

(57) ABSTRACT

A liquid application material that is capable of forming an oxidized insulator as a result of baking is applied onto a support substrate to produce an object of processing. Then, a mold having projection structures with intervals of nanometers is pressed against the applied liquid material to produce corresponding recess structures. Thereafter, the applied liquid material is baked in oxygen-containing gas or oxidized in ozone or oxygen plasma to make it electrically highly resistive. Subsequently, a layer to be anodized is formed on said oxidized insulator. Then, the layer to be anodized is actually anodized in an acidic solution to form fine holes that are aligned with the respective recess structures in the anodized layer. Accordingly, fine recess structures can be manufactured with ease.

10 Claims, 12 Drawing Sheets (1) PREPARATION OF MOLD OF SiC (2) APPLICATION OF RESIST (3) FORMATION OF COMPRESSED PATTERN (4) ION-MILLING (5) REMOVAL OF RESIST

STRUCTURE MANUFACTURING METHOD

BACKGROUND OF THE INVENTION

1. Field of the Invention

This invention relates to a method of manufacturing recess/projection structures with very fine intervals of a scale of nanometers. This invention also relates to a magnetic device using a structure.

2. Related Background Art

So-called nano-imprinting methods have been proposed in recent years as techniques for forming micro-structures of dimensions of nanometers on the surface of an object to be processed by directly pressing a mold of recess/projection structures against the object (see, inter alia, U.S. Pat. No. 5,772,905 and Japanese Patent Application Laid-Open No. 2000-232095). They represent new technological developments and do not relate to lithography that uses light and/or an electron beam.

With any of the proposed techniques, a mold 101 prepared through a process using an electron beam as shown in FIGS. 6A, 6B, 6C, 6D and 6E of the accompanying drawings and having a pattern of projection structures that are arranged at intervals of tens to hundreds of several nanometers is pressed against the resist 102 formed on a flat semiconductor wafer 103 and then removed to produce a pattern of recess/projection structures. Then, the recess structures 104 are removed by ion-milling and the product of ion-milling is used as mask for etching the semiconductor wafer 103 to produce structures of a size of nanometers including recesses/projections that corresponds to the original stamper. With the technique, it is possible to form a micro-pattern easily within a short period of time that cannot be realized by photolithography. Additionally, the substrate and the mold are prevented from being destroyed as the pressure of the press operation is reduced by means of a resin layer and etching is used for the actual processing operation.

Meanwhile, there are also known techniques for forming an alumina nano-hole at any selected position by preparing a recess structure on the surface of an aluminum thin film, using photolithography, direct writing with a beam or a press technique as described above, and conducting an anodization (anodic oxidation) process, using the recess as starting point for forming the nano-hole (see, inter alia, Japanese Patent Application Laid-Open No. H10-121292). However, recesses/projections formed on the surface of a metal thin film by agglomerations of grains have a height of several to tens of several nanometers, they can be obstacles when forming a very fine starting point pan em (to be referred to as nano-structures hereinafter) on the surface of the thin film that shows gaps substantially as large as the above cited height.

A metal thin film of the type under consideration is formed not completely by single crystals but by a number of agglomerations of crystal grains. Steps are produced at the crystal boundaries. In other words, recesses/projections are formed on the surface of the thin film.

FIGS. 7A, 7B, 7C, 7D, 7E and 7F illustrate a technique for avoiding such recesses/projections. Referring to FIGS. 7A, 7B, 7C, 7D, 7E and 7F, an electro-conductive layer 202, an insulation layer 201 and a resist layer 204 are sequentially formed on a support substrate 203 (FIGS. 7A and 7B) and then a pattern of recesses 205 is formed in the resist layer 204 by photolithography or an interference exposure technique (FIG. 7C). Then, the electro-conductive layer 202 is made to become exposed by etching the insulation layer, using the resist pattern as mask (FIG. 7D). Then, an aluminum film 206 is arranged thereon and subjected to anodization. With the above-described process, nano-holes can be formed as a pattern on the electro-conductive layer due to the electric current that flows from the exposed parts of the electro-conductive layer 202 (FIGS. 7E and 7F). While recess structures may be formed as a pattern on the aluminum film as shown in FIG. 7E, it accelerates the formation of nano-holes aligned with the pattern of the electro-conductive layer and hence does not give rise to any problem. Thus, it is possible to prepare nano-holes arranged at very fine intervals without being affected by the recesses/projections of agglomerations of grains on the surface of the aluminum film.

Techniques for filling such regular nano-structures with metal, semiconductor or a magnetic material have also been proposed along applications of the techniques including coloring, magnetic recording mediums, EL light emitting elements, electrochromic elements, optical elements, solar cells and gas sensors.

SUMMARY OF THE INVENTION

However, while the problem of recesses/projections on the surface of an aluminum film can be avoided with the technique as described above by referring to FIGS. 7A, 7B, 7C, 7D, 7E and 7F, it is desired to further simplify the process of forming an electro-conductive layer, an insulation layer and a photoresist layer by application and also simplify the process of exposure and development for the purpose of cost reduction.

In view of the above identified problem, it is therefore the object of the present invention to provide an improved method of manufacturing micro-structures of a size of nanometers on an object of processing.

According to the invention, the above object is achieved by providing a method of manufacturing a structure comprising:

a step of applying a material capable of forming an oxidized insulator as a result of oxidation onto a substrate;

a step of forming recesses at predetermined positions on the surface of said material;

a step of forming an oxidized insulator by oxidizing said material;

a step of forming a layer to be anodized (i.e., subjected to anodic oxidation) on said oxidized insulator; and a step of forming holes directed respectively toward said recesses in said layer to be anodized by anodizing said layer to be anodized.

Preferably, said substrate is electro-conductive and said method further comprises a step of exposing the surface of said electro-conductive substrate by etching said oxidized insulator remaining on the bottoms of said recesses after said oxidation step.

Preferably, said substrate is electro-conductive and said method further comprises a step of exposing the surface of said electro-conductive substrate by etching said material remaining on the bottoms of said recesses after said recess-forming step.

Preferably, said oxidation step is a baking step.

Preferably, said oxidation step and said etching step are conducted simultaneously.

Preferably, said filling step is a plating, sputtering or evaporation step.

Preferably, said method further comprises a step of filling a filling agent into said recesses.

Preferably, said layer to be anodized is a metal layer containing aluminum as principal ingredient.

Preferably, said step of forming recesses is a step of pressing a mold having projections at predetermined positions against the surface of said material.

DESCRIPTION OF THE PREFERRED EMBODIMENTS

Now, the present invention will be described in greater detail by referring to the accompanying drawings that illustrate preferred embodiments of the invention.

A method of manufacturing a structure according to the invention comprises: thinly applying a liquid material apt to form an oxidized insulator, which may be specifically a glass application material (SOG material, Spin-On-Glass, silicon-containing polymer, silica-containing liquid material, aluminum-containing liquid material or the like); forming recess structures on the surface of the applied liquid material that is apt to form an oxidized insulator as a result of baking by pressing a mold having projection structures with intervals of a size of nanometers against the surface; oxidizing the applied liquid material to make it electrically highly resistive; dry etching, if necessary, the applied liquid material so as to expose the electro-conductive layer at the recess structures; forming a layer to be anodized on said oxidized insulator; and anodizing said layer to be anodized so as to form the structure.

A structure manufacturing method according to the invention can simplify the process of manufacturing structures and manufacture micro-structures showing a high aspect ratio at low cost in a short period of time if compared with known methods because it utilizes an insulation layer of an applied liquid material that is apt to form an oxidized insulator as a result of baking and a nano-imprinting technique for the applied liquid material that is apt to form an oxidized insulator as a result of baking for the purpose of forming a pattern.

Now, an embodiment of structure manufacturing method according to the invention will be described. It is a nano-structure manufacturing method.

FIGS. 1A, 1B, 1C, 1D, 1E and 1F are schematic illustrations of steps (a) through (f) of the first embodiment of nano-structure manufacturing method according to the invention.

Figure 1A:
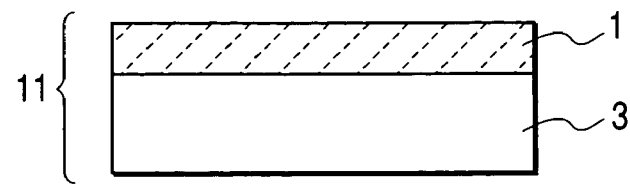
FIGS. 1A, 1B, 1C, 1D, 1E and 1F are schematic illustrations of steps (a) through (f) of the first embodiment of nano-structure manufacturing method according to the invention.

As shown in FIGS. 1A, 1B, 1C, 1D, 1E and 1F, with the nano-structure manufacturing method, firstly a liquid application material 1 that is apt to form an oxidized insulator as a result of baking is applied onto a support substrate 3 and baked to drive off the solvent to produce an object of processing 11 (FIG. 1A: step (1)). Then, a mold 4 having projection structures 5 with intervals of nanometers is pressed against the applied liquid material 1 that is apt to form an oxidized insulator as a result of baking to produce corresponding recess structures 6 (FIG. 1B: step (2)). Thereafter, the applied liquid material is baked in oxygen-containing gas or oxidized 7 in ozone or oxygen plasma to make it electrically highly resistive (FIG. 1C: step (3)). Subsequently, a layer to be anodized 9 is formed on said oxidized insulator (FIG. 1D: step (4)). Then, the layer to be anodized is actually anodized in an acidic solution (FIG. 1E: step (5)). Finally, fine holes 12 that are aligned with the respective recess structures 6 are formed in the anodized layer 9.

More specifically, a mold 4 having at least a recess and a projection is prepared by means of lithography using electron beams, X-rays, ultraviolet rays or rays of visible light and a dry or wet etching technique, an electron beam direct writing technique or an anodizing technique. The surface of the projection structure 5 is preferably flat. If two or more than two projections are formed, the top surfaces of the projection structures 5 are preferably flush with each other.

Then, a liquid application material 1 that is apt to form an oxidized insulator as a result of baking is applied onto a support substrate 3 that is typically made of silicon or glass by means of a technique of spin coating or the like (FIG. 1A: step (1)). The film thickness of the liquid application material 1 that is apt to form an oxidized insulator as a result of baking is smaller than the height of the projection structures 5 because, if the projection structures 5 are baked in the step of pressing the mold, air bubbles can be trapped between the projection structures 5 and the liquid application material apt to form an oxidized insulator as a result of baking to obstruct the formation of recess structures 6.

Figure 1B:
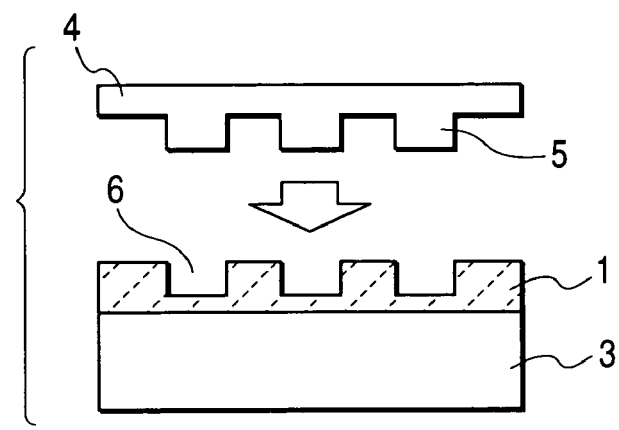

Thereafter, the mold 4 and the applied liquid material 1 apt to form an oxidized insulator as a result of baking are pressed against and then removed from each other to produce recess structures 6 in the applied liquid material 1 apt to form an oxidized insulator as a result of baking that correspond to the projection structures 5 of the mold 4 (FIG. 1B: step (2)). Then, the applied liquid material 1 apt to form an oxidized insulator as a result of baking is actually baked in oxygen-containing gas or oxidized in ozone or oxygen plasma to make it highly electrically resistive (FIG. 1C: step (3)).

Subsequently, a film that is made of aluminum or an aluminum-silicon alloy or the like that contains aluminum as principal ingredient is laid on the baked material by sputtering or evaporation as layer to be anodized 9. Then, recess structures 8 that are similar to the recess structures 6 are formed on surface of the layer to be anodized 9 (FIG. 1D: step (4)). Then, the layer to be anodized 9 is actually anodized in an etchant that may be an aqueous solution of oxalic acid or phosphoric acid by using itself as anode to produce fine holes. As a voltage that matches the desired nano-hole intervals is applied to the electrodes, nano-holes 12 are produced along the pattern of the recess structures 6 (FIG. 1E: step (5)).

With the above described technique, the support substrate 3 may be an insulator and the recesses/projections of agglomerations of grains of the layer to be anodized do not provide any obstacle so long as the recess/projection structures of the applied liquid material that is apt to form an oxidized insulator as a result of baking show a high aspect ratio. Preferably, the anodization is suspended before the nano-holes get to the applied and oxidized liquid material layer 7 so as to leave the layer to be oxidized unoxidized under the nano-holes. Then, it is possible not only to mechanically fill the nano-holes with a liquid material but also to fill them with a content material 10 produced by electrolytic plating, using the liquid material itself as electrode. For the purpose of the present invention, nano-structures can be prepared if the surface of the substrate shows recesses/projections to a certain extent.

A liquid application material apt to form an oxidized insulator as a result of baking that can be used for the purpose of the invention may be a material where silicon molecules, titanium molecules or the like are bonded in organic molecules or inorganic molecules, a material where such molecules are bonded in alcohol or a solution where fine particles of silicon, titanium or the like are suspended in an organic or inorganic substance. It is known that, when such a material is baked at high temperature, the organic substance is decomposed and silicon molecules are oxidized to form a silicon oxide film. Specific examples of molecules that can be used for the purpose of the invention include molecules of Ti, Zr, Hf, Al, Si, Ge, Nb, Mo, Ta and W.

Now, the second embodiment of nano-structure manufacturing method will be described by referring to FIGS. 2A, 2B, 2C, 2D, 2E, 2F and 2G.

Figure 2A:
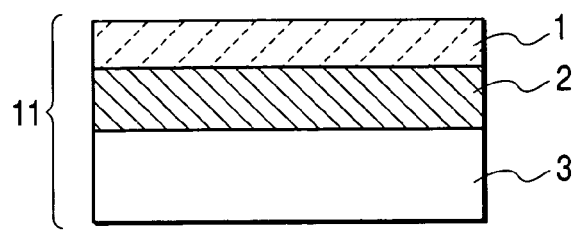
FIGS. 2A, 2B, 2C, 2D, 2E, 2F and 2G are schematic illustrations of steps (a) through (g) of the second embodiment of nano-structure manufacturing method according to the invention.

As shown in FIGS. 2A, 2B, 2C, 2D, 2E, 2F and 2G, with the second embodiment of nano-structure manufacturing method, firstly a liquid application material 1 that is apt to form an oxidized insulator as a result of baking is applied onto an electro-conductive layer 2 formed on a support substrate 3 to produce an object of processing 11 (FIG. 2A: step (1)). Then, a mold 4 having projection structures 5 with intervals of nanometers is pressed against the layer of the applied liquid material 1 that is apt to form an oxidized insulator as a result of baking to produce corresponding recess structures 6 (FIG. 2B: step (2)). Thereafter, the applied liquid material is baked in oxygen-containing gas or oxidized in ozone or oxygen plasma to make it electrically highly resistive (FIG. 2C: step (3)). Subsequently, the layer of the applied liquid material apt to form an oxidized insulator as a result of baking that is remaining on the bottoms of the recess structures 6 are removed by means of a wet or dry etching technique to expose the electro-conductive layer 2 (FIG. 2D: step (6)). Then, a layer to be anodized 9 is formed on said oxidized insulator (FIG. 2E: step (4)). Then, the layer to be anodized 9 is actually anodized in an acidic solution (FIG. 2F: step (7)). Finally, fine holes 12 are formed in the anodized layer 9 and aligned with the respective recess structures 6.

Figure 2B:
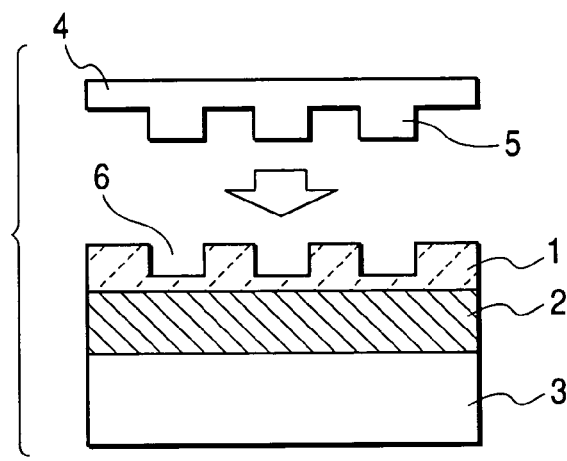
Figure 2C:
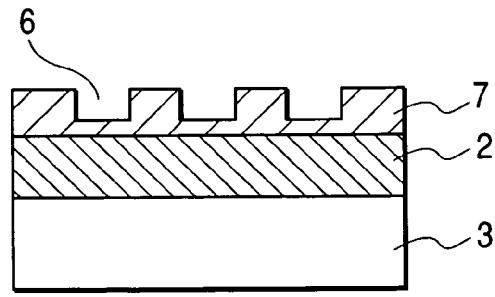
Figure 2D:
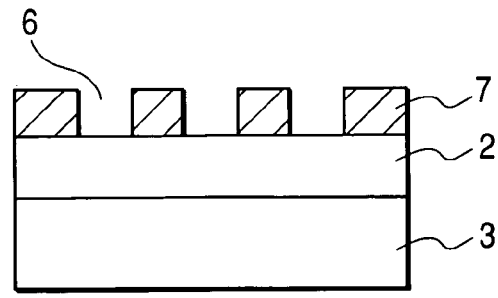
Figure 2E:
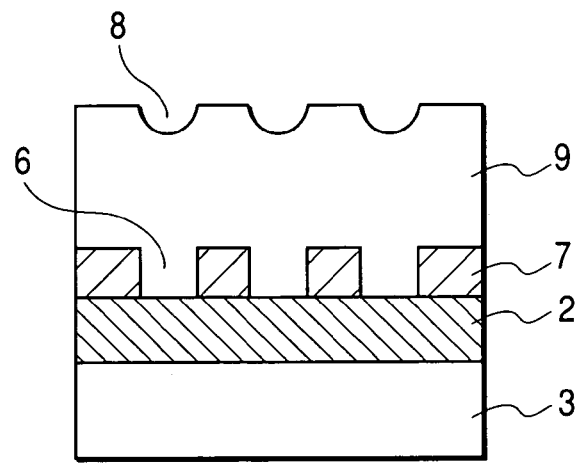

For instance, the steps (1), (2) and (3) are conducted as in the first embodiment and the applied liquid material 7 that is oxidized is etched either by dry etching, using fluorine type gas, or by wet etching, using an aqueous solution of dilute hydrofluoric acid, to expose the lower electro-conductive layer 2 (FIG. 2D: step (6)). The electro-conductive layer 2 may also be etched in this step. Then, a film that is made of aluminum or an aluminum-silicon alloy or the like that contains aluminum as principal ingredient is laid thereon by sputtering or evaporation as layer to be anodized 9 (FIG. 2E: step (4)). Then, as a voltage that matches the desired nano-hole intervals is applied to the electrodes, using the layer to be anodized 9 as anode, an electric current flows from the exposed parts of the electro-conductive layer 2 and nano-holes 12 are produced along the pattern of the recess structures 6 (FIG. 2F: step (7)).

With the above described technique, it is not necessary to use the recess structures 8 formed on the surface of the layer to be anodized 9 as starting points of nano-holes unlike the first embodiment but it is only necessary that an exposed pattern of the lower electro-conductive layer 2 is formed. Then, the surface coarseness, if any, of the layer to be anodized 9 practically does not give rise to any problem. Therefore, the phenomenon that the formation of nano-holes is obstructed from the starting points by the recesses/projections of agglomerations of grains that are produced when the layer to be anodized 9 is formed practically does not occur so that it is possible to prepare very fine nano-structures with intervals smaller than the sizes of the agglomerations of grains.

If the electro-conductive layer 2 is etched in step (6) to produce recess structures in the electro-conductive layer 2, recess structures 8 may also be formed on the surface of the layer to be anodized 9. These recess structures operate as starting points as in the case of their counterparts of the prior art and only accelerate the formation of nano-structures according to the invention.

Now, the third embodiment of nano-structure manufacturing method will be described by referring to FIGS. 3A, 3B, 3C, 3D, 3E, 3F and 3G.

Figure 3A:
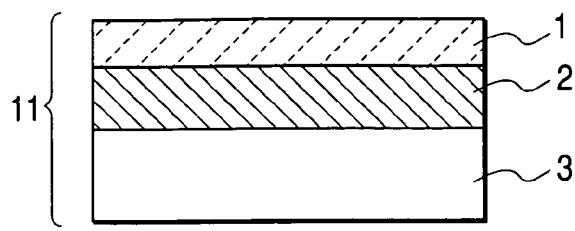
FIGS. 3A, 3B, 3C, 3D, 3E, 3F and 3G are schematic illustrations of steps (a) through (g) of the third embodiment of nano-structure manufacturing method according to the invention.
Figure 3B:
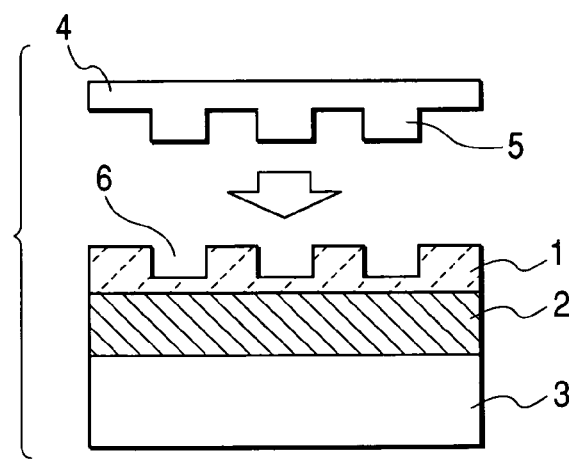

As shown in FIGS. 3A, 3B, 3C, 3D, 3E, 3F and 3G, with the third embodiment of nano-structure manufacturing method, firstly a liquid material 1 that contains silicon is applied onto an electro-conductive layer 2 formed on a support substrate 3 to produce an object of processing 11 (FIG. 3A: step (1)). Then, a mold 4 having projection structures 5 with intervals of nanometers is pressed against the applied liquid material that is apt to form an oxidized insulator as a result of baking to produce corresponding recess structures 6 (FIG. 3B: step (2)). Then, the applied liquid material remaining on the bottoms of the recess structures 6 are removed by wet or dry etching to expose the electro-conductive layer 2 (FIG. 3C: step (6') and the applied liquid material is baked in oxygen-containing gas or oxidized in ozone or oxygen plasma to make it electrically highly resistive (FIG. 3D: step (3')). Thereafter, a layer to be anodized 9 is formed on said oxidized insulator (FIG. 3E: step (4)). Then, the layer to be anodized is actually anodized in an acidic solution (FIG. 3F: step (7)). Finally, fine holes 12 that are aligned with the respective recess structures 6 are formed in the anodized layer 9.

Figure 3C:
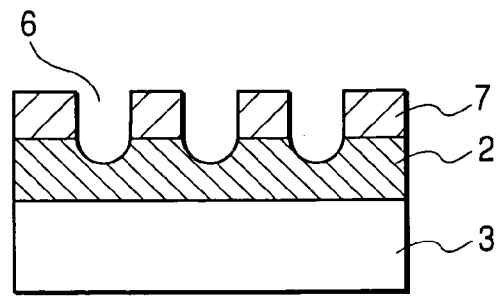

More specifically, the steps (1) and (2) are conducted as in the second embodiment and the applied liquid material 1 that is apt to form an oxidized insulator as a result of baking is etched by means of a dry or wet etching technique in a non-oxidizing condition to expose the lower electro-conductive layer 2 (FIG. 3C: step (6')). Thereafter, the applied liquid material is baked in oxygen-containing gas or oxidized in ozone or oxygen plasma to make it electrically highly resistive (FIG. 3D: step (3')). Subsequently, a film that is made of aluminum or an aluminum-silicon alloy or the like that contains aluminum as principal ingredient is laid thereon by sputtering or evaporation as layer to be anodized 9 (FIG. 3E: step (4)). Then, the layer to be anodized 9 is actually anodized in an etchant that may be an aqueous solution of oxalic acid or phosphoric acid by using itself as anode to produce fine holes (FIG. 3F: step (7)). In this instance, again, the electro-conductive layer may be etched.

The steps (3) and (6) may be conducted together in the second embodiment. Then, with the nano-structure manufacturing method, the applied liquid material 1 that is apt to form an oxidized insulator as a result of baking is etched by means of a dry etching technique, using a mixture gas of etching gas and oxygen gas and the residue on the bottoms of the recess structures 6 is removed to expose the electro-conductive layer 2, while the liquid material is oxidized. For example, fluorine type gas and oxygen gas may be mixed to an appropriate ratio for dry etching.

Figure 1C:
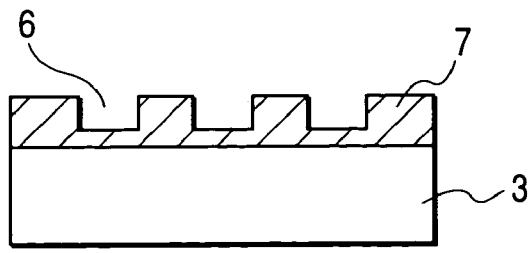
Figure 1D:
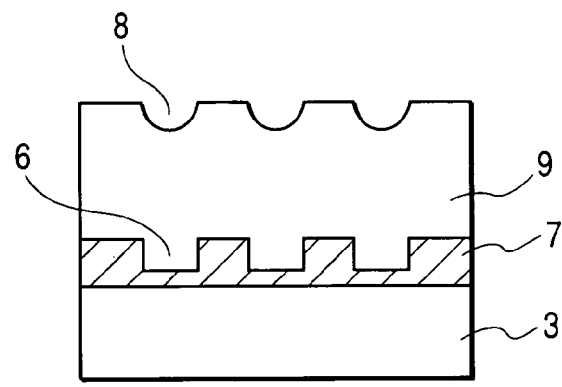
Figure 1E:
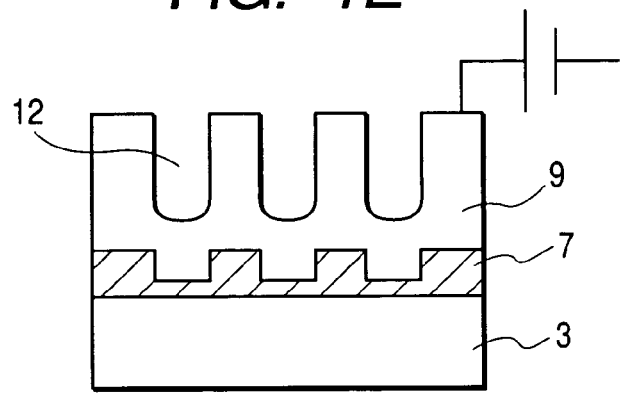
Figure 1F:
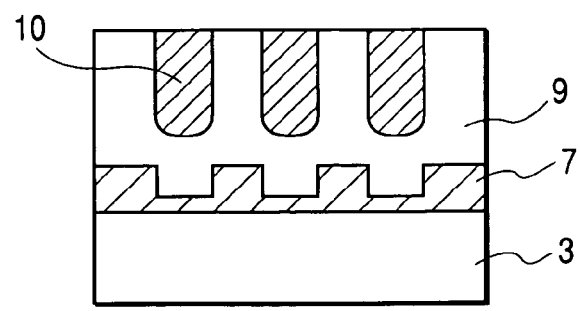
Figure 2F:
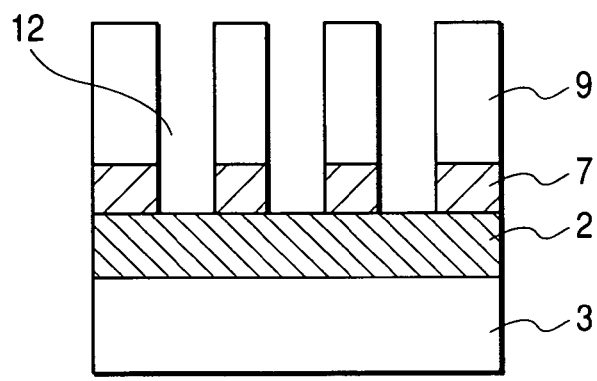
Figure 2G:
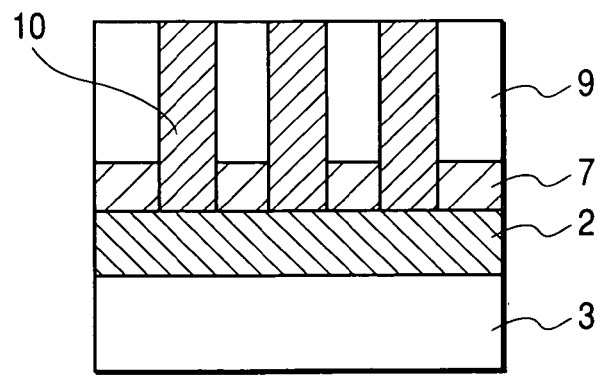
Figure 3D:
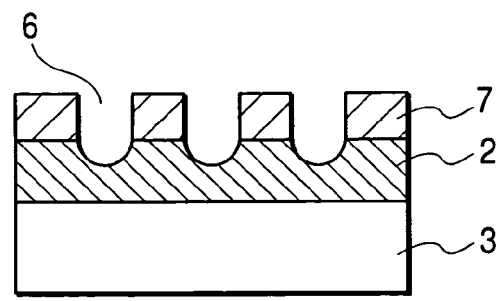
Figure 3E:
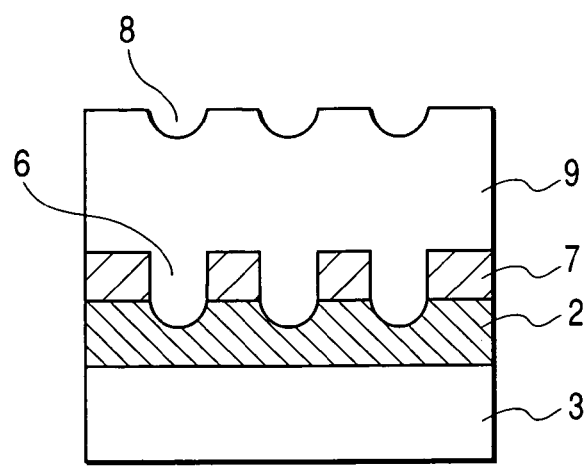
Figure 3F:
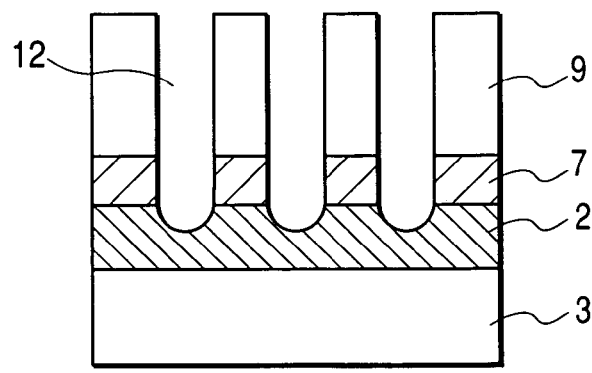
Figure 3G:
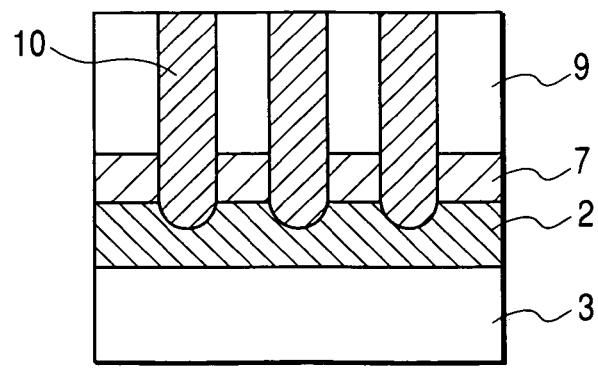

With a nano-structure manufacturing method according to the invention, the recesses 12 of the nano-structure prepared by any of the first through third embodiment are filled with a content material 10 by electrolytic plating, by non-electrolytic plating or by means of a mechanically filling technique (FIGS. 1F, 2G and 3G).

For example, a content material 10 may be filled into the recesses by electrolytic plating of nickel or the like, by non-electrolytic plating of platinum or the like, by means of a technique of filling a fluid material that contains a dielectric material or a light-emitting material and then hardening the fluid material or by means of sputtering.

Now, the present invention will be described further by way of examples and by referring to the accompanying drawings.

EXAMPLE 1

In this example, the first embodiment of the invention is used.

As shown in FIGS. 1A, 1B, 1C, 1D, 1E and 1F, with the first embodiment of nano-structure manufacturing method, firstly a liquid application material 1 that contains silicon is applied onto a support substrate 3 to produce an object of processing 11 (step (1)). Then, a mold 4 having projection structures 5 with intervals of nanometers is pressed against the layer of the liquid material 1 that contains silicon to produce corresponding recess structures 6 (step (2)). Thereafter, the liquid material is baked in oxygen-containing gas or oxidized in ozone or oxygen plasma to make it electrically highly resistive (step (3)). Subsequently, a layer to be anodized 9 is formed on said oxidized liquid material (step (4)). Then, the layer to be anodized is actually anodized in an acidic solution (step (5)). Finally, fine holes that are aligned with the respective recess structures 6 are formed in the anodized layer 9.

Figure 5:
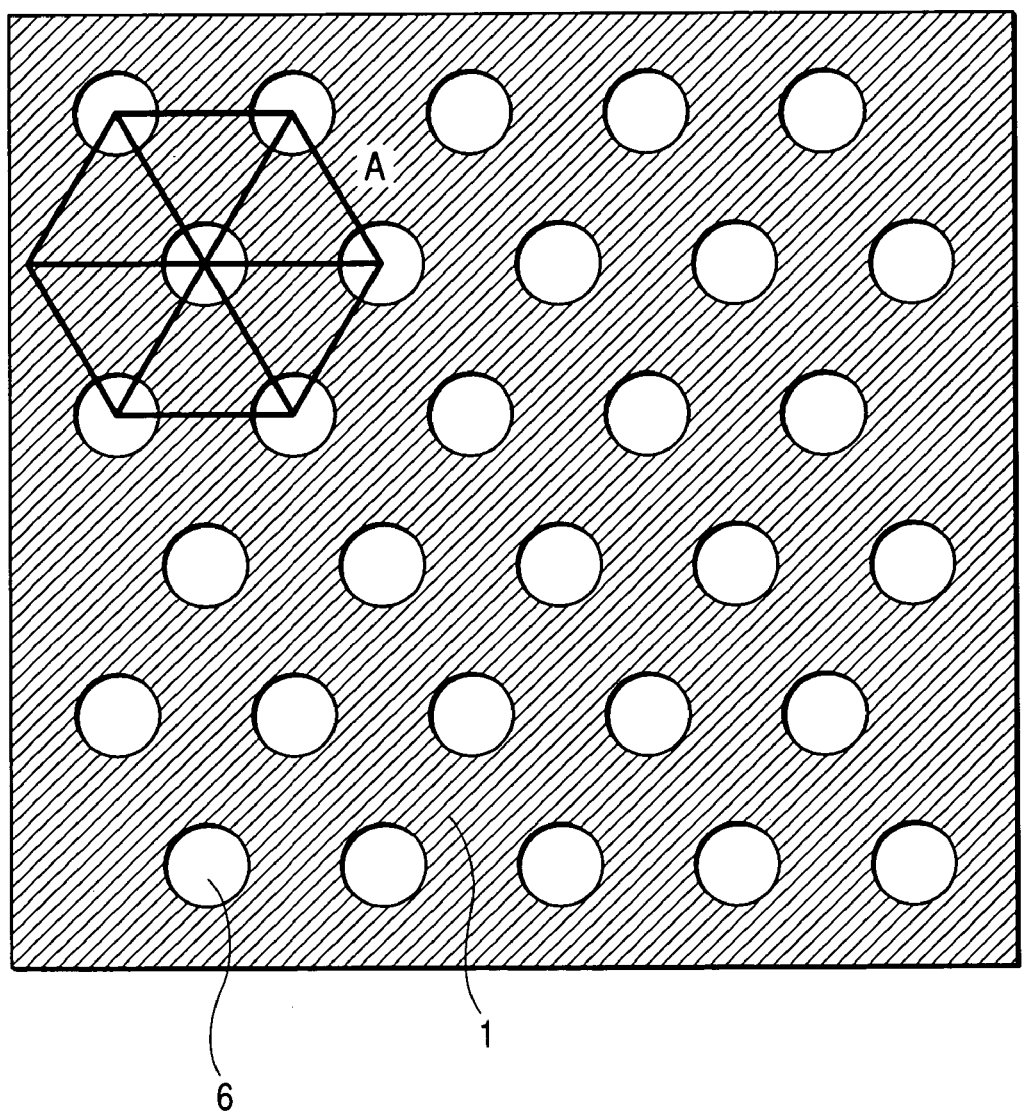
FIG. 5 is a schematic plan view of a recess structure formed in an applied liquid material that is apt to form an oxidized insulator as a result of baking.
Figure 6A:
FIGS. 6A, 6B, 6C, 6D and 6E are schematic illustrations explaining a known nano-structure manufacturing method.
Figure 6B:
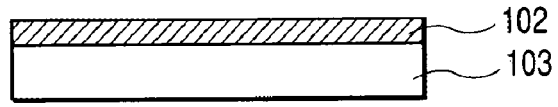
Figure 6C:
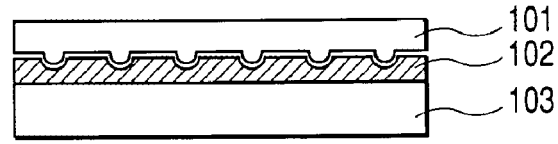
Figure 6D:
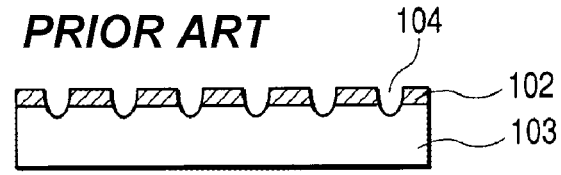
Figure 6E:
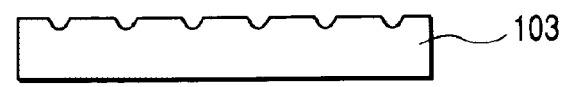
Figure 7A:
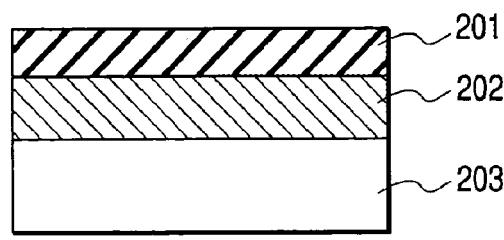
FIGS. 7A, 7B, 7C, 7D, 7E and 7F are schematic illustrations of step (a) through (f) of another known nano-structure manufacturing method.
Figure 7B:
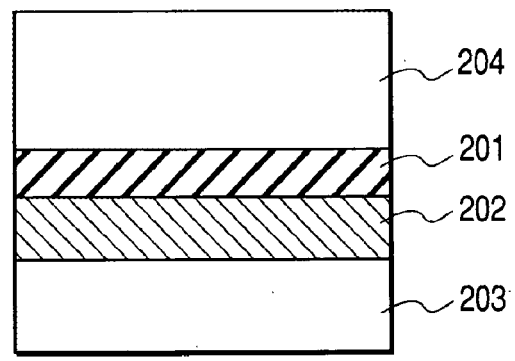
Figure 7C:
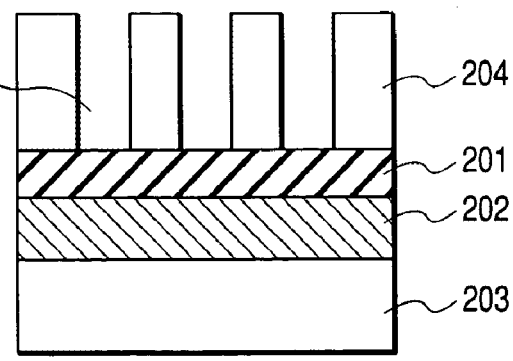
Figure 7D:
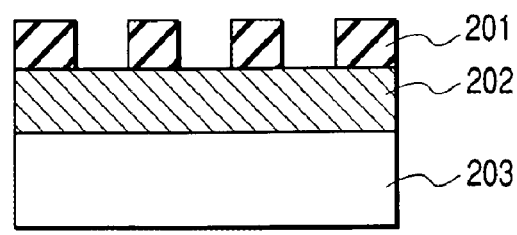
Figure 7E:
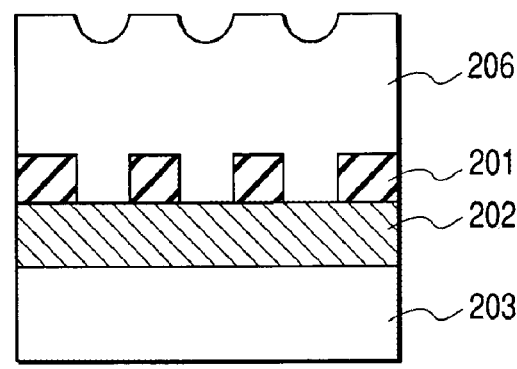
Figure 7F:
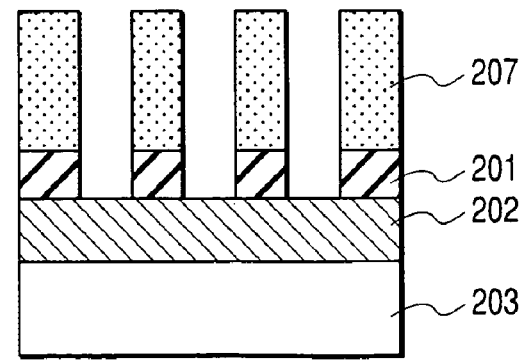

For instance, as shown in FIG. 1A, a liquid material that contains silicon (e.g., Fox-15 commercially available from Dow Corning or $SiO_2$ liquid application material commercially available from Kojundo Chemical Laboratory Co., Ltd., is diluted by a diluent, which is methylisobutylketone (MIBK), and subsequently applied to the surface of a glass support substrate 3 to a thickness of 50 nm by spin coating to form a layer of the silicon-containing liquid material 1, if necessary, by annealing the liquid material. Subsequently, cylindrical projection structures 4 are prepared on a silicon substrate by way of a process involving exposure to an electron beam and dry etching to produce a mold 4. The cylindrical projection structures 4 have a diameter of 30 nm and a height of 75 nm and arranged regularly to form a triangular grid with intervals of 100 nm. A release agent is applied onto the mold 4 to a thickness of 10 nm and the mold is pressed against the layer of the silicon-containing liquid under pressure of 500 kgf/cm² at room temperature for 30 seconds then removed from the latter (FIG. 1B). FIG. 5 shows a plan view of the object of processing in this stage. In FIG. 5, A=100 nm. The silicon-containing liquid material 1 is then baked in oxygen-containing air at 170° C. for 30 minutes to drive off the diluent and oxidize the silicon so as to make it inorganic and form an electrically highly resistive layer (FIG. 1C). The silicon does not need to be completely oxidized. It is sufficient for it to become electrically highly resistive.

Thereafter, an aluminum film is laid thereon to a thickness of 200 nm. As a result, recess structures 8 that correspond to the respective recess structures 6 are formed on the surface of the aluminum film (FIG. 1D). The object of processing is then immersed in an aqueous solution of oxalic acid (0.3 mol/L) and subjected to anodization, using the surface of the aluminum film as anode, by applying 40V at 6° C. Then, nano-holes start to be formed from the recess structures 8 on the surface of the layer that is to be anodized. As a result, alumina nano-holes 12 that are arranged regularly to form a pattern similar to the pattern of the projection structures 5 of the mold are produced. The anodization is terminated before the nano-holes get to the oxidized silicon-containing polymer layer 7 and the object of processing is immersed into an aqueous solution of phosphoric acid (0.3 mol/L) to dissolve and remove the aluminum oxide coat formed on the walls of the nano-holes. As a result, the nano-holes are cleared so that they can be filled with a content material 10 by electrolytic plating. A titanium thin film may be laid under the aluminum film to a thickness of about 5 nm by sputtering for the purpose of preventing the aluminum film being peeled off.

Finally, an electrolytic plating operation is conducted in a cobalt sulfate bath (30° C.) by using the object of processing as cathode, to deposit cobalt as the content material 10 in the alumina nano-holes (FIG. 1F).

The pattern of the projection structures 5 of the mold are regularly arranged to form a triangular grid in this example. An alumina nano-hole is formed for a single projection structure 5. However, the pattern may be regularly arranged to form a rectangular grid and the anodization voltage may be so adjusted as to produce a plurality of nano-holes by each projection structure 5.

EXAMPLE 2

In this example, the second embodiment of the invention is used.

As shown in FIGS. 2A, 2B, 2C, 2D, 2E, 2F and 2G, with the second embodiment of nano-structure manufacturing method, firstly a liquid application material 1 that contains silicon is thinly applied onto an electro-conductive layer 2 (step (1)). Then, a mold 4 having projection structures 5 with intervals of nanometers is pressed against the layer of the applied liquid material 1 to produce corresponding recess structures 6 on the surface of the silicon-containing liquid material (step (2)). Thereafter, the silicon-containing liquid material is oxidized typically by means of baking so as to make it inorganic and come into an electrically highly resistive state 7 (step (3)). Then, the residue in the recess structures 6 of the silicon-containing liquid material is removed by etching to expose the electro-conductive layer 2 (step (6)). Then, a layer to be anodized 9 is formed on said oxidized insulator (step (4)). Then, the layer to be anodized is actually anodized (step (7)) to prepare nano-structures.

FIGS. 2A, 2B, 2C, 2D, 2E, 2F and 2G illustrate typical steps of the second embodiment. As shown in FIG. 2A, an electro-conductive layer 2 of cupper is formed to a thickness of 10 nm on a silicon support substrate 3 by sputtering.

Then, a liquid material that contains liquid silicon (e.g., Fox-15 commercially available from Dow Corning) is diluted by a diluent, which is methylisobutylketone (MIBK) and subsequently applied to the surface of the support substrate 3 to a thickness of 50 nm by spin coating to form a layer of the silicon-containing liquid material 1. The step (2) may be identical with that of Example 1. The silicon-containing liquid material is oxidized in oxygen plasma in the step (3) and recess structures 6 are formed by means of press (FIGS. 2B and 2C). Thereafter, the residue on the bottoms of the recess structures 6 of the oxidized silicon-containing liquid material layer 7 is removed by dry etching that is conducted in $CF_4$ gas. The electro-conductive layer 2 of copper is practically not etched at all (FIG. 2D). However, if argon gas is used, the electro-conductive layer 2 is also etched to form deep recess structures 8 on the aluminum surface in addition to the steps of the recess structures 6 of the silicon-containing liquid material 1 so that the formation of patterned nano-structures can be accelerated. If the depth of the recess structures 6 that are produced by press is very small and they conduct an electric current during the anodization step, this step may be omitted.

The step (4) may be identical with that of Example 1. The object of processing is then immersed in an aqueous solution of oxalic acid (0.3 mol/L) and subjected to anodization at 16° C. with 40V, using the layer to be anodized itself as anode. As a result, alumina nano-holes 12 that are regularly arranged to form a pattern similar to the pattern of the projection structures 5 of the mold are produced as shown in FIG. 2F.

Finally, the object of processing is subjected to an electrolytic plating step in a cobalt sulfate bath (30° C.), using the object of processing as cathode, to deposit cobalt in the alumina nano-holes as content material 10 (FIG. 2G). Crystallized and oriented content material of cobalt can be obtained from the electro-conductive layer of copper when the electrolytic plating step is conducted in appropriate conditions.

Cylindrical structures of cobalt that are regularly arranged can be used for magnetic devices and can also be applied to vertical magnetic recording mediums that use a method of vertically magnetizing the recording medium (in the direction of the film thickness) to record data. Unlike a longitudinal recording method that can give rise to magnetic attenuation when the recording density rises, a vertically magnetizing method reduces the demagnetizing field to produce a stable state as the recording density rises. Therefore, vertical magnetic recording mediums are expected to be recording mediums of the next generation.

EXAMPLE 3

In this example, the third embodiment of the invention is used.

As shown in FIGS. 3A, 3B, 3C, 3D, 3E, 3F and 3G, with the third embodiment of nano-structure manufacturing method, firstly a liquid application material 1 that contains silicon is applied onto an electro-conductive layer 2 (step (1)). Then, a mold 4 having projection structures 5 with intervals of nanometers is pressed against the layer of the applied liquid material 1 to produce corresponding recess structures 6 on the surface of the silicon-containing liquid material 1 (step (2)). Then, the electro-conductive layer 2 is exposed in the areas of the recess structures by etching (step (6')). Thereafter, the silicon-containing liquid material is oxidized by oxidation, which is typically baking (step (3')).

Then, a layer 9 to be anodized is formed thereon (step (4)) and then actually anodized (step (7)) to produce nano-structures.

FIGS. 3A, 3B, 3C, 3D, 3E, 3F and 3G illustrate typical steps of the third embodiment. The steps (1) and (2) may be identical with those of Example 1. Recess structures 6 are formed by means of press (FIGS. 3A and 3B), although the electro-conductive layer 2 is made of palladium and has a thickness of 10 nm. Then, the silicon-containing liquid material and the electro-conductive layer of palladium are subjected to dry etching, using argon plus $CF_4$ as etching gas not containing oxygen, and the residue on the bottoms of the recess structures 6 are removed to expose the electro-conductive layer 2 of palladium (FIG. 3C). Then, the object of processing is oxidized in ozone to make the silicon inorganic and produce an electrically highly resistive layer (FIG. 3D).

When the step (4) (FIG. 3E) is conducted as in Example 2, alumina nano-holes are obtained as shown in FIGS. 3E and 3F. Finally, as the object of processing is immersed in a non-electrolytic platinum plating bath, the palladium exposed on the bottoms of the nano-holes operates as catalyst to deposit a content material 10 of platinum.

EXAMPLE 4

In this example, the fourth embodiment of the invention is used.

With the fourth embodiment of nano-structure manufacturing method, the steps (3) and (4) of the second embodiment are conducted together by means of dry etching, using oxygen-containing gas or by means of wet etching using an acidic solution.

Figure 4A:
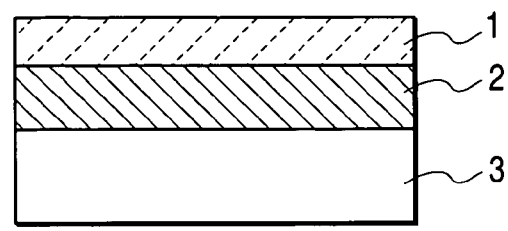
FIGS. 4A, 4B, 4C, 4D, 4E and 4F are schematic illustrations of steps (a) through (f) of the fourth embodiment of nano-structure manufacturing method according to the invention.
Figure 4B:
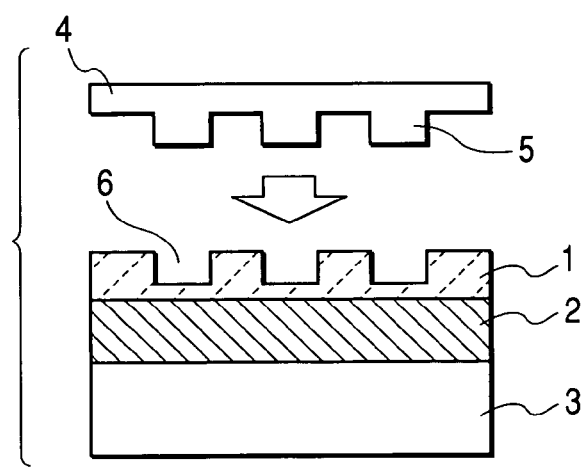
Figure 4C:
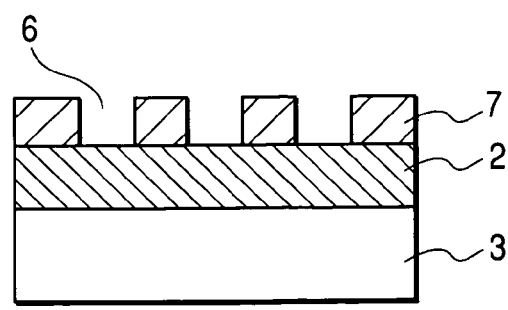
Figure 4D:
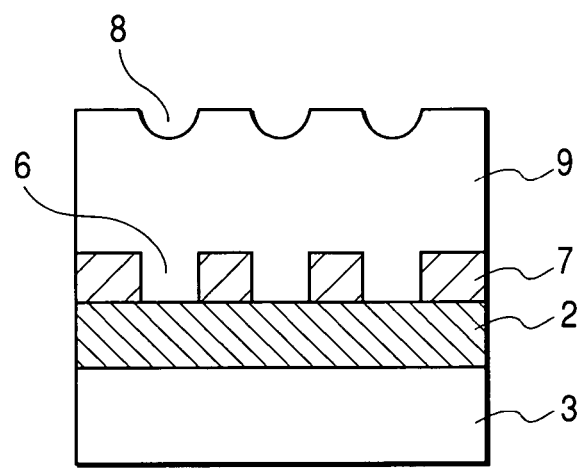
Figure 4E:
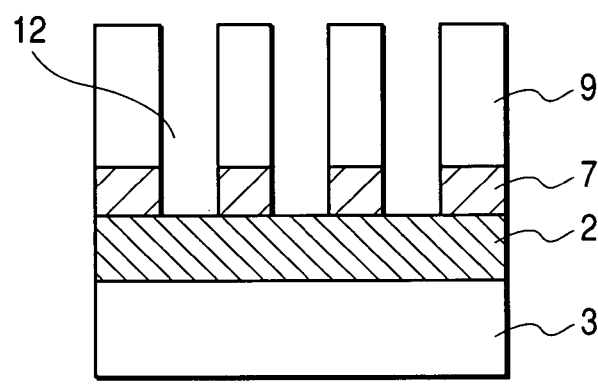
Figure 4F:
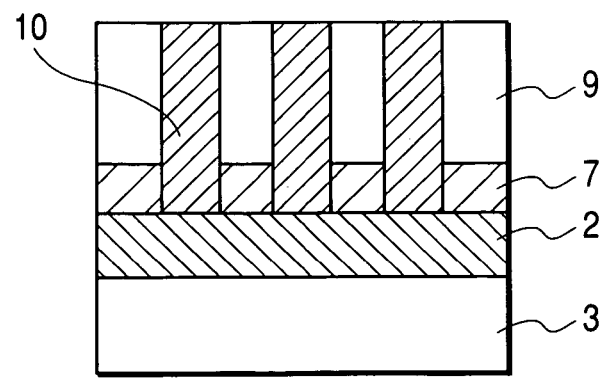

As shown in FIGS. 4A and 4B, with the fourth embodiment of nano-structure manufacturing method, recess structures 6 are formed by means of press as in Example 2. Then, $SF_6$ is used as gas for etching a silicon-containing liquid material that is partly oxidized and partly not oxidized and oxygen is mixed with the gas in order to further oxidize the silicon-containing liquid material to perform dry etching (FIG. 4C). With this arrangement, it is possible to oxidize the silicon-containing liquid material and remove the residue on the bottoms of the recess structures 6 at the same time. Attention needs to be paid to the conditions in which these steps are conducted because the layer of the silicon-containing liquid material becomes too thin when the mixing ratio of $SF_6$ is too high and/or the duration of the dry-etching step is too long. As the steps (3) and (6) are conducted as in Example 2, nab-structures as shown in FIGS. 4D and 4E are obtained. Finally, as liquid polymethylmethaciylate is mechanically filled into the alumina nano-holes, nano-structures of polymethylmethaciylate is obtained.

A structure manufacturing method according to the invention is a method of manufacturing structures by applying a nano-imprinting method for a liquid material that contains liquid silicon so as to make it electrically highly resistive and also using dry etching or wet etching. With a method according to the invention, fine recess structures can be manufactured with ease.

What is claimed is:

1. A method of manufacturing a structure comprising:
a step of applying an oxidizable material onto a substrate;
a step of forming a plurality of recesses at a plurality of predetermined positions on a surface of said oxidizable material to form a recessed material, each recess having a bottom;

a step of oxidizing said recessed material to form an oxidized insulator;

a step of forming an anodizable layer on said oxidized insulator; and a step of forming holes directed respectively toward said recesses in said anodizable layer by anodizing said anodizable layer.

2. A method according to claim 1, wherein said substrate is an electro-conductive substrate and said method further comprises a step of exposing the surface of said electro-conductive substrate by etching said oxidized insulator remaining on the bottoms of said recesses after said oxidation step.

3. A method according to claim 2, wherein said oxidation step and said etching step are conducted simultaneously.

4. A method according to claim 1, wherein said substrate is an electro-conductive substrate and said method further comprises a step of exposing the surface of said electro-conductive substrate by etching said material remaining on the bottoms of said recesses before said oxidation step.

5. A method according to claim 1, wherein said oxidation step is a baking step.

6. A method according to claim 1, further comprising: a step of filling a filling agent into said recesses.

7. A method according to claim 6, wherein said filling step is a plating, sputtering or evaporation step.

8. A method according to claim 1, wherein said anodizable layer is a metal layer containing aluminum as a principal ingredient.

9. A method according to claim 1, wherein said step of forming recesses is a step of pressing a mold against the surface of said material, said mold having a plurality of projections at positions corresponding to said predetermined positions of said recesses.

10. A method according to claim 1, wherein said step of forming recesses comprises forming the recesses on the surface of said oxidizable material without forming recesses in said substrate.

* * * * *

UNITED STATES PATENT AND TRADEMARK OFFICE
CERTIFICATE OF CORRECTION

| | | |
|---|---|---|
| PATENT NO. | : 7,100,263 B2 | |
| APPLICATION NO. | : 10/865403 | |
| DATED | : September 5, 2006 | |
| INVENTOR(S) | : Aya Imada et al. | |

It is certified that error appears in the above-identified patent and that said Letters Patent is hereby corrected as shown below:

Column 1

Line 49, replace "pan em" with --pattern--.

Column 10

Line 49, replace "nab-structures" with --nano-structures--.

Line 50, replace "polymethylmethaciylate" with --polymethylmethacrylate--.

Line 52, replace "polymethylmethaciylate" with --polymethylmethacrylate--.

Signed and Sealed this

Twenty-eighth Day of November, 2006

JON W. DUDAS
*Director of the United States Patent and Trademark Office*